United States Patent [19]

Nakamura et al.

[11] Patent Number: 5,500,568
[45] Date of Patent: Mar. 19, 1996

[54] ORGANIC EL DEVICE

[75] Inventors: Hiroaki Nakamura; Tadashi Kusumoto, both of Sodegaura, Japan

[73] Assignee: Idemitsu Kosan Co., Ltd., Tokyo, Japan

[21] Appl. No.: 199,255

[22] PCT Filed: Jul. 22, 1993

[86] PCT No.: PCT/JP93/01020

§ 371 Date: Mar. 4, 1994

§ 102(e) Date: Mar. 4, 1994

[87] PCT Pub. No.: WO94/03032

PCT Pub. Date: Feb. 3, 1994

[30] Foreign Application Priority Data

Jul. 23, 1992 [JP] Japan ................... 4-197272
Oct. 8, 1992 [JP] Japan ................... 4-270573

[51] Int. Cl.$^6$ ................................. H05B 33/26
[52] U.S. Cl. ................................. 313/503; 313/504
[58] Field of Search .................... 313/501, 503, 313/504, 505, 506, 498; 428/917; 427/66

[56] References Cited

U.S. PATENT DOCUMENTS

| | | |
|---|---|---|
| 3,112,197 | 11/1963 | Neugebauer et al. . |
| 3,173,050 | 3/1965 | Gurnee . |
| 3,180,703 | 4/1965 | Ableson et al. . |
| 3,180,729 | 4/1965 | Klupfel et al. . |
| 3,189,447 | 6/1965 | Neugebauer et al. . |
| 3,240,597 | 3/1966 | Fox . |
| 3,257,203 | 6/1966 | Süs et al. . |
| 3,382,394 | 5/1968 | Mehl . |
| 3,526,501 | 9/1970 | Fox . |
| 3,542,544 | 11/1970 | Seus et al. . |
| 3,567,450 | 3/1971 | Brantly et al. . |
| 3,615,402 | 10/1971 | Rule . |
| 3,615,404 | 10/1971 | Price . |
| 3,658,520 | 4/1972 | Brantly et al. . |
| 3,717,462 | 2/1973 | Negishi et al. . |
| 3,820,989 | 6/1974 | Rule et al. . |
| 4,012,376 | 3/1977 | Wright . |
| 4,127,412 | 11/1978 | Rule et al. . |
| 4,175,961 | 11/1979 | Wright et al. . |
| 4,232,103 | 11/1980 | Limburg et al. . |
| 4,278,746 | 7/1981 | Goto et al. . |
| 4,539,507 | 9/1985 | Van Slyke et al. . |
| 4,885,211 | 12/1989 | Tang et al. .............................. 313/506 |
| 4,950,950 | 8/1990 | Perry et al. . |

FOREIGN PATENT DOCUMENTS

| | | |
|---|---|---|
| 0278757 | 8/1988 | European Pat. Off. . |
| 64-54692 | 3/1989 | Japan . |
| 2-15595 | 1/1990 | Japan . |
| 3-231970 | 10/1991 | Japan . |

OTHER PUBLICATIONS

Polymer Preprints, Japan vol. 40, No. 10, pp. 3582–3584, (1991).

*Primary Examiner*—Donald J. Yusko
*Assistant Examiner*—Nimesh Patel
*Attorney, Agent, or Firm*—Frishauf, Holtz, Goodman, Langer & Chick

[57] ABSTRACT

An organic EL device having, as a cathode, a vapor deposited film containing at least one metal A selected from Pb, Sn and Bi and a metal B having a work function of 4.2 eV or less, provided by the present invention, has high chemical stability of the cathode with time and high power conversion efficiency, and is useful as a display device and a light-emitting device.

10 Claims, No Drawings

ORGANIC EL DEVICE

TECHNICAL FIELD

The present invention relates to an organic EL device (electroluminescence device) used as a display device or a light-emitting device.

TECHNICAL BACKGROUND

An organic EL device is constituted by placing at least a thin layer of an organic light-emitting material (light-emitting layer) between a pair of electrodes facing to each other. In this organic EL device, electrons injected into a light-emitting layer from a cathode directly or through an electron-injecting layer and holes injected into the light-emitting layer from an anode directly or through a hole-injecting layer recombine in the light-emitting layer, whereby light is emitted.

As means for improving the light emission properties of the organic EL device based on the above light-emitting mechanism, it is known to select or improve the organic light-emitting material, to improve the film quality of the light-emitting layer or to select or improve a cathode material. Of these, the means of selecting or improving the cathode material is generally aimed at the improvement of the efficiency of injection of electrons into the light-emitting layer for improving the light emission properties. It is therefore being attempted to use a variety of electrically conductive metals, alloys or intermetallic compounds having small work functions as a material for the cathode.

For example, U.S. Pat. No. 3,173,050 and U.S. Pat. No. 3,382,394 disclose organic EL devices whose cathode is formed of alkali metal such as Na-K alloy. The organic EL devices disclosed in these U.S. Patents are desirable in that the quantum efficiency is high (see RCA Review Vol. 30, page 322), while they are not practical since alkali metals and alloy formed of alkali metals alone are highly active and chemically unstable.

It is therefore variously proposed to form cathodes from metals other than alkali metals. For example, U.S. Pat. No. 4,539,507 discloses an organic EL device whose cathode is formed of In. JP-A-3-231970 discloses an organic EL device whose cathode is formed of Mg-In alloy. Further, European Patent 0278757 discloses an organic EL device provided with a cathode formed of a layer containing a plurality of metals other than alkali metals, at least one of which metals other than alkali metals has a work function of 4 eV or less (Mg-based electrode formed of Mg and one of Ag, In, Sn, Sb, Te and Mn, such as Mg-Ag electrode).

Further, various organic EL devices whose cathodes are formed of mixtures of at least 11 at. % of metals having excellent electron-injecting properties such as Li, Na, Ca and Sr with relatively stable metals such as Mg, Al, In and Sn are disclosed in Autumn Meeting held in 1991 (Polymer Preprints, Japan, Vol. 40, No. 10, page 3,582). However, the organic EL devices disclosed in the Meeting are inferior to an organic EL device having an Mg-Ag electrode as a cathode in efficiency (power conversion efficiency).

As described above, there have been various proposals for forming cathodes from metals having electroninjecting properties, while these cathodes are poor in chemical stability with time, and organic EL devices having these cathodes have been unsatisfactory in power conversion efficiency.

It is an object of the present invention to provide a novel organic EL device having a cathode having high stability with time and improved power conversion efficiency.

DISCLOSURE OF THE INVENTION

The organic EL device of the present invention which achieves the above objects has a feature in that it has, as a cathode, a vapor deposited film containing at least one metal A selected from Pb, Sn and Bi and a metal B having a work function of 4.2 eV or less.

PREFERRED EMBODIMENTS FOR WORKING THE INVENTION

The present invention will be detailed hereinafter.

As described above, the cathode of the organic EL device of the present invention is formed of a vapor deposited film containing at least one metal A selected from Pb, Sn and Bi and a metal B having a work function of 4.2 eV or less. Specific examples of the metal B having a work function of 4.2 eV or less include In, Cd, Mn, Ti, Ta, Zr, La, Ca, Li, Ba, Na, Mg, Gd, K, Y and Yb. In view of the improvement in electron-injecting properties, metals having a work function of 4.0 eV or less are preferred. Specific examples of such metals include La, Ca, Li, Ba, Na, Mg, Gd, K, Y and Yb which are all described above. As the metal B, one metal may be used or a plurality of metals may be used.

The method for forming the vapor deposited film containing the metal A and the metal B is not specially limited. Specific examples of the above method include direct alloy vapor deposition methods and multi-source simultaneous vapor deposition methods, which employ any one of a resistance heating vapor deposition method, an electron beam heating vapor deposition method, a high-frequency induction heating method, a molecular beam epitaxy method, a hot wall vapor deposition method, an ion plating method, an ionized cluster beam method, a diode sputtering method, a diode magnetron sputtering method, a triode and tetraode plasma sputtering methods, an ionized beam sputtering method. For effectively producing a cathode having a desired composition, it is particularly preferred to employ a multi-source simultaneous vapor deposition method.

The cathode produced by forming a film as above is satisfactory so long as it contains the metal A and the metal B. The content of the metal A in the cathode is preferably 90 to 99.999 at. %. The reason therefor is that when the content of the metal A is 90 to 90.999 at. %, the metal A constitutes the matrix of the cathode and improves the chemical stability of the cathode with time. The content of the metal A is particularly preferably 95 to 99.99 at. %.

When a vapor deposited film of the cathode is formed by the multi-source simultaneous vapor deposition method for example, the composition of the cathode can be controlled by properly setting the deposition rates of the metal A and the metal B. The deposition rate of the metal A is at least 2 nm/sec., particularly at least 4 nm/sec., and the vapor deposition for the metal B is 0.5 nm/sec. or less, particularly 0.2 nm/sec or less. When two metals (e.g., Pb and Sn) or more are used as the metal A, the total of the deposition rates of these metals for forming the metal A is preferably at least 2 nm/sec., more preferably at least 4 nm/sec. When two metals (e.g., Mg and Ca) or more are used as the metal B, the total of the deposition rates of these metals for forming the metal B is preferably 0.5 nm/sec. or less, particularly preferably 0.2 nm/sec. or less. The deposition rate of the metal A is greater than the deposition rate of the metal B as described above, whereby there can be obtained a vapor deposited film having a greater content of the metal A and a smaller content of the metal B. Further, by combining the metal A and the metal B in this manner, there can be obtained a cathode having excellent electron-injecting properties. The thickness of the so-obtained cathode is not specially limited so long as it has conductivity within the film, while the thickness is preferably 10 to 400 run, particularly preferably 30 to 200 nm.

The constitution of the organic EL device of the present invention is not specially limited so long as it has the above-described cathode. For example, the constitution of the organic EL device includes (1) anode/light-emitting layer/cathode, (2) anode/hole-injecting layer/light-emitting layer/cathode, (3) anode/light-emitting layer/electron-injecting layer/cathode, (4) anode/hole-injecting layer/light-emitting layer/electron-injecting layer/cathode, and the like. The organic EL device of the present invention may have any one of the above constitutions. Further, when the organic EL device of the present invention is produced, the materials for, and the method for forming, the members other than the cathode are not specially limited, and these other members may be formed from various materials by a variety of methods, as will be described later.

The organic EL device having the so-obtained vapor deposited film containing the metal A and the metal B, provided by the present invention, not only has high chemical stability of the cathode with time, but also has power conversion efficiency equivalent to or higher than that of an organic EL device having an Mg-based cathode which is considered to have high power conversion efficiency among conventional organic EL devices.

The materials for, and the method for forming, the members other than the cathode in the organic EL device of the present invention will be described below.

For example, the organic compound that can be used as a material for the light-emitting layer is not specially limited, while there can be used benzothiazole, benzoimidazole and benzooxazole fluorescent brighteners, metal chelated oxinoid compounds and styrylbenzene compounds.

Specifically, the above fluorescent brighteners are disclosed, for example, in JP-A-59-194393. Typical examples thereof include benzooxazole fluorescent brighteners such as 2,5-bis(5,7-di-tert-pentyl-2-benzooxazolyl)-1,3,4-thiadiazole, 4,4'-bis(5,7-tert-pentyl-2-benzooxazolyl)stilbene, 4,4'-bis[5,7-di-(2-methyl-2-butyl)-2-benzooxazolyl]stilbene, 2,5-bis(5,7-di-tert-pentyl-2-benzooxazolyl)thiophene, 2,5-bis[5-α,α-dimethylbenzyl-2-benzooxazolyl]thiophene, 2,5-bis[5,7-di-(2-methyl-2-butyl)-2-benzooxazolyl]-3,4-diphenylthiophene, 2,5-bis(5-methyl-2-benzooxazolyl)thiophene, 4,4'-bis(2-benzooxazolyl)biphenyl, 5-methyl-2-[2-[4-(5-methyl-2-benzooxazolyl)phenyl]vinyl]benzooxazole, 2-[2-(4-chlorophenyl)vinyl]naphtho[1,2-d]oxazole; benzothiazole fluorescent brighteners such as 2,2'-(p-phenylenedivinylene)-bisbenzothiazole; and benzoimidazole fluorescent brighteners such as 2-[2-[4-(2-benzoimidazole-)phenyl]vinyl]benzoimidazole and 2-[2-(4-carboxyphenyl)vinyl]benzoimidazole. Further, other useful compounds are listed in Chemistry of Synthetic Dyes, 1971, pages 628–637 and 640.

The above chelated oxinoid compounds are disclosed, for example, in JP-A-63-295695. Typical examples thereof include 8-hydroxyquinoline metal complexes such as tris(8-quinolinol)aluminum, bis(8-quinolinol)magnesium, bis(benzo[f]-8-quinolinol)zinc, bis(2-methyl-8-quinolinolate)aluminum oxide, tris(8-quinolinol)indium, tris(5-methyl-8-quinolinol)aluminum, 8-quinolinollithium, tris(5-chloro-8-quinolinol)gallium, bis(5-chloro-8-quinolinol)potassium and poly[zinc(II)-bis(8-hydroxy-5-quinolinonyl)methane, and dilithiumepindolidione.

The above styrylbenzene compounds are disclosed, for example, in European Patent 0319881 and European Patent 0373582. Typical examples thereof include 1,4-bis(2-methylstyryl)benzene, 1,4-bis(3-methylstyryl)benzene, 1,4-bis(4-methylstyryl)benzene, distyrylbenzene, 1,4-bis(2-ethylstyryl)benzene, 1,4-bis(3-ethylstyryl)benzene, 1,4-bis(2-methylstyryl)-2-methylbenzene and 1,4-bis(2-methylstyryl)-2-ethylbenzene.

Further, distyrylpyrazine derivatives disclosed in JP-A-2-252793 can be also used as a material for the light-emitting layer. Typical examples of distyrylpyrizine derivatives include 2,5-bis(4-methylstyryl)pyrazine, 2,5-bis(4-ethylstyryl)pyrazine, 2,5-bis[2-(1-naphthyl)vinyl]pyrazine, 2,5-bis(4-methoxystyryl)pyrazine, 2,5-bis[2-(4-biphenyl)vinyl]pyrazine and 2,5-bis[2-(1-pyrenyl)vinyl]pyrazine.

Further, polyphenyl compounds disclosed, for example, in European Patent 0387715 can be also used as a material for the light-emitting layer.

In addition to the above fluorescent brighteners, metal chelated oxinoid compounds and styrylbenzene compounds, the material for the light-emitting layer can be also selected, for example, from 12-phthaloperinone (J. Appl. Phys., Vol. 27, L713 (1988)), 1,4-diphenyl-1,3-butadiene, 1,1,4,4-tetraphenyl-1,3-butadiene (thus far, Appl. Phys. Lett. Vol. 56, 799 (1990)), naphthalimde derivatives (JP-A-2-305886), perylene derivatives (JP-A-2-189890), oxadiazole derivatives (JP-A-2-216791, including oxadiazole derivatives disclosed by Hamada et al., in Proceedings of No. 38th Spring Meeting 1993 The Japan Society of Applied Physics and Related Societies), aldazine derivatives (JP-A-2-220393), pyraziline derivatives (JP-A-2-220394), cyclopentadiene derivatives (JP-A-2-289675), pyrrolopyrrol derivatives (JP-A-2-296891), styrylamine derivatives (Appl. Phys. Lett., Vol. 56, 799 (1990)), coumarin compounds (JP-A-2-191694), and polymer compounds disclosed in W090/13148 and Appl. Phys. Lett., vol. 58, 18, p. 1982 (1991).

The material for the light-emitting layer is particularly preferably selected from aromatic dimethylidyne compounds (disclosed in European Patent 0388768 and JP-A-3-231970). Specific examples thereof include 1,4-phenylenedimethylidyne, 4,4'-phenylenedimethylidyne, 2,5-xylylenedimethylidyne, 2,6-naphthyldimethylidyne, 1,4-biphenylenedimethylidyne, 1,4-p-terphenylenedimethylidyne, 9,10-anthracendiyldimethylidyne, 4,4'-bis(2,2-di-tert-butylphenylvinyl)biphenyl (to be abbreviated as DTBPVBi hereinafter), 4,4'-bis(2,2-diphenylvinyl)biphenyl (to be abbreviated as DPVBi hereinafter), and derivatives of these.

The light-emitting layer can be formed from the above material, for example, by any one of known methods such as a vapor deposition method, a spin coating method, a casting method and an LB method. The light-emitting layer is particularly preferably a molecular deposition film. The term "molecular deposition film" refers to a thin film formed by deposition from a raw material compound in a gaseous state or a film formed by solidification from a material compound in a solution state or in a liquid phase state. This molecular deposition film is generally distinguishable from a thin film formed by the LB method (molecular built-up film) due to differences in aggregation structure and high-order structure and subsequent functional differences.

Further, as disclosed in JP-A-57-51781, the light-emitting layer can be also formed by dissolving a binder such as a resin and a material compound in a solvent to prepare a solution and forming a thin film from the solution.

The film thickness of the so-formed light-emitting layer is not specially limited, and can be determined as required, while it is generally preferably in the range of 5 nm to 5 μm.

The light-emitting layer of the organic EL device has an injection function with which holes can be injected from an anode or the hole-injecting layer and electrons can be injected from a cathode or the electron-injecting layer when an electric filed is applied, a transportation function with which injected charge (electrons and holes) is carried by the force of the electric field and a light emission function with which a field for the recombination of electrons and holes is provided to generate light emission. There can be a difference between the ease with which holes are injected and the ease with which electrons are injected. Further, there can be a difference between the mobility of holes and the mobility of electrons which represent the transportation function, while it is preferred that at least ones of these should be moved.

The material for the anode is preferably selected from metal, alloys, electrically conductive compounds and mixtures of these, which all have a large work function (at least 4 eV). Specific examples thereof include metals such as Au and dielectric transparent materials such as CuI, ITO, $SnO_2$ and ZnO. The anode can be produced by forming a thin film from any one of the above materials by a vapor deposition method or a sputtering method.

When light emitted from the light-emitting layer is transmitted through the anode, the transmittance of the anode is preferably larger than 10%. The sheet resistance of the anode is preferably several hundreds Ω/□ or less. Although differing depending upon materials, the thickness of the anode is generally in the range of 10 nm to 1 μm, preferably 10 to 200 nm.

The material for the hole-injecting layer which is optionally provided is selected from photoconductive materials conventionally used as hole-injecting materials and known materials used for hole-injecting layers of organic EL devices. The material for the hole-injecting layer has any one of hole injection performance and barrier performance against electrons, and it may be any one of an organic material and an inorganic material.

Specific examples thereof include triazole derivatives (see U.S. Pat. No. 3,112,197), oxadiazole derivatives (see U.S. Pat. No. 3,189,447), imidazole derivatives (see Japanese Patent Publication No. 37-16096), polyarylalkane derivatives (see U.S. Pat. No. 3,615,402, U.S. Pat. No. 3,820,989, U.S. Pat. No. 3,542,544, JP-B-45-555, JP-B-51-10983, JP-A-51-93224, JP-A-55-17105, JP-A-56-4148, JP-A-55-108667, JP-A-55-156953 and JP-A-56-36656), pyrazoline derivatives and pyrazolone derivatives (see U.S. Pat. No. 3,180,729, U.S. Pat. No. 4,278,746, JP-A-55-88064, JP-A-55-88065, JP-A-49-105537, JP-A-55-51086, JP-A-56-80051, JP-A-56-88141, JP-A-57-45545, JP-A-54-112637 and JP-A-55-74546), phenylenediamine derivatives (see U.S. Pat. No. 3,615,404, JP-B-51-10105, JP-B-46-3712, JP-B-47-25336, JP-A-54-53435, JP-A-54-110536 and JP-A-54-119925), arylamine derivatives (see U.S. Pat. No. 3,567,450, U.S. Pat. No. 3,180,703, U.S. Pat. No. 3,240,597, U.S. Pat. No. 3,658,520, U.S. Pat. No. 4,232,103, U.S. Pat. No. 4,175,961, U.S. Pat. No. 4,012,376, JP-B-49-35702, Japanese Patent Publication No. 39-27577, JP-A-55-144250, JP-A-56-119132, JP-A-56-22437 and West Germany Patent 1,110,518), amino-substituted chalcone derivatives (see U.S. Pat. No. 3,526,501), oxazole derivatives (those disclosed in U.S. Pat. No. 3,257,203), styrylanthracene derivatives (see JP-A-56-46234), fluorenone derivatives (see JP-A-54-110837), hydrazone derivatives (see U.S. Pat. No. 3,717,462, JP-A-54-59143, JP-A-55-52063, JP-A-55-52064, JP-A-55-46760, JP-A-55-85495, JP-A-57-11350, JP-A-57-148749 and JP-A-2-311591), stilbene derivatives (see JP-A-61-210363, JP-A-61-228451, JP-A-61-14642, JP-A-61-72255, JP-A-62-47646, JP-A-62-36674, JP-A-62-10652, JP-A-62-30255, JP-A-60-93445, JP-A-60-94462, JP-A-60-174749 and JP-A-60-175052), silazane derivatives (see U.S. Pat. No. 4,950,950), polysilanes (JP-A-2-204996), anilne copolymers (JP-A-2-282263), and elecytrically conductive high-molecular weight oligomers (particularly thiophene oligomers) disclosed in JP-A-1-211399.

The above compounds can be used as a material for the hole-injecting layer. It is preferred to use porphyrin compounds (those disclosed in JP-A-63-295695), aromatic tertiary amine compounds and styrylamine compounds (see U.S. Pat. No. 4,127,412, JP-A-53-27033, JP-A-54-58445, JP-A-54-149634, JP-A-54-64299, JP-A-55-79450, JP-A-55-144250, JP-A-56-119132, JP-A-61-295558, JP-A-61-98353 and JP-A-63-295695), and it is particularly preferred to use aromatic tertiary amine compounds.

Typical examples of the above porphyrin compounds include porphine, 1,10,15,20-tetraphenyl-21H,23H-porphine copper (II), 1,10,15,20-tetraphenyl-21H,23H-porphine zinc (II), 5,10,15,20-tetrakis(pentafluorophenyl)-21H, 23H-prophine, silicone phthalocyanine oxide, aluminum phthalocine (metal-free), dilithium phthalocyanine, copper tetramethylphthalocyanine, copper phthalocyanine, chromium phthalocyanine, zinc phthalocyanine, lead phthalocyanine, titanium phthalocyanine, Mg phthalocyanine and copper octamethylphthalocyanine.

Typical examples of the above aromatic tertiary amine compounds and styrylamine compounds include N,N,N',N'-tetraphenyl-4,4'-diaminophenyl, N,N'-diphenyl-N,N'-bis-(3-methylphenyl)-[ 1,1'-biphenyl]-4,4'-diamine (to be abbreviated as TPD hereinafter), 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl)phenylmethane, bis(4-di-p-tolylaminophenyl)phenylmethane, N,N'-diphenyl-N,N'-di-( 4-methoxyphenyl)-4,4'-diaminobiphenyl, N,N,N',N'-tetraphenyl-4,4'-diaminodiphenyl ether, 4,4'-bis(diphenylamino)quadriphenyl, N,N,N-tri(p-tolyl)amine, 4-(di-p-tolylamino)-4'-[4(di-p-tolylamino)styryl]stilbene, 4-N,N-diphenylamino-( 2-diphenylvinyl)benzene, 3-methoxy-4'-N, N-diphenylaminostyrylbenzene, and N-phenyl carbazole.

The above aromatic dimethylidyne compounds descibed as the material for the light-emitting layer can be also used as a mateiral for the hole-injecting layer.

The hole-injecting layer can be produced, for example, by forming a thin film from any one of the above materials by a known method such as vacuum deposition method, a spin coating method, a casting method or an LB method. The film thickness of the hole-injecting layer is not specially limited, while it is generally 5 nm to 5 μm. The hole-injecting layer may have a single-layered structure formed of at least one of the above materials or a multi-layered structure of the same composition or different compositions.

The electron-injecting layer which is optionally provided has only to have the function of transporting electrons injected from a cathode to the light-emitting layer. The material therefor can be selected from known compounds as required.

Specific examples thereof includes nitro-substituted fluorenone derivatives disclosed in JP-A-57-149259, anthraquinodimethane derivatives disclosed in JP-A-58-55450 and JP-A-63-104061, diphenylquinone derivatives disclosed in Polymer Preprints, Japan, Vol. 37, No. 3 (1988), page 681, thiopyran dioxide derivatives, heterocyclic tetracarboxylic acid anhydrides such as naphthalene perylene, carbodiimide, fluorenylidenemethane derivatives disclosed in Japanese Journal of Applied Physics, 27, L 269 (1988), JP-A-60-69657, JP-A-61-143764 and JP-A-61-148159, anthraquinodimethane derivatives and anthrone derivatives disclosed in JP-A-61-225151 and JP-A-61-233750, oxadiazole derivatives disclosed in Appl. Phys. Lett., 55, 15, 1489 or by Hamada et al., in the aforesaid Proceedings of No. 38th Spring Meeting 1993 The Japan Society of Applied Physics and Related Society, and series of electron-conducting compounds disclosed in JP-A-59-194393. In addition, JP-A-59-194393 discloses the above electron-conducting compounds as materials for the light-emitting layer, while the study of the present inventors has revealed that they can be also used as materials for the electron-injecting layer.

The material for the electron-injecting layer can be also selected from metal complexes of 8-quinolinol derivatives. Specific examples thereof include tris(8-quinolinol)aluminum, tris(5,7-dichloro-8-quinolinol)aluminum, tris(5,7-dibromo-8-quinolinol)aluminum, tris(2-methyl-8-quinolinol)aluminum and the same metal complexes as those except that the central metal is replaced with In, Mg, Cu, Ca, Sn or Pb.

Further, the material for the electron-injecting layer is also preferably selected from metal-free phthalocyanine, metal phthalocyanine and the same metal-free or metal phthalocyanine whose terminal is replaced with an alkyl group or sulfone group. The distyrylpyrazine derivatives described as the materials for the light-emitting layer can be also used as materials for the electron-injecting layer.

The electron-injecting layer can be produced, for example, by forming a thin film from any one of the above materials by a known method such as vacuum deposition method, a spin coating method, a casting method or an LB method. The film thickness of the electron-injecting layer is not specially limited, while it is generally 5 nm to 5 μm. The electron-injecting layer may have a single-layered structure formed of at least one of the above materials or a multilayered structure of the same composition or different compositions.

The material for the hole-injecting layer can be also selected from hole-injecting and transporting materials formed of inorganic compounds such as p-type-Si and p-type SiC, and the material for the electron-injecting layer can be also selected from electron-injection and transporting materials formed of inorganic compounds such as n-type Si and n-type-SiC. Specific examples of the inorganic materials for the hole-injecting layer and the inorganic materials for the electron-injecting layer are those inorganic semiconductors disclosed in International Laid-open Publication WO90/05998.

The organic EL device of the present invention, which can be produced by forming the light-emitting layer, the anode, the optional hole-injecting layer and the optional electron-injecting layer from the above-described materials by the above-described methods and forming the cathode by the above-described method, may have any constitution as described above. The following is a brief explanation of one embodiment of the production of an organic EL device having a constitution of anode on a substrate/hole-injecting layer/light-emitting layer/cathode.

First, the anode is produced on a proper substrate by forming a thin film from the anode material by a vapor deposition method, a sputtering method, etc., such that the film thickness is 1 μm or less, preferably in the range of 10 to 200 nm. Then, the hole-injecting layer is formed on the anode. As described above, the hole-injecting layer can be formed by a vacuum deposition method, a spin coating method, a casting method or an LB method, while it is preferably formed by a vacuum deposition method since a homogeneous film can be easily obtained and since this method is almost free from the formation of pin holes. When the hole-injecting layer is formed by a vacuum deposition method, the vapor deposition conditions differ depending upon an employed compound (material for the hole-injecting layer) and the crystal structure and aggregation structure of the intended hole-injecting layer. Generally, however, it is preferred to select the deposition conditions from the following ranges as required. The temperature of the vapor deposition source is 50° to 450° C., the vacuum degree is $10^{-5}$ to $10^{-3}$ Pa, the deposition rate is 0.01 to 50 nm/sec., the substrate temperature is −50° to 300° C., and the film thickness is 5 nm to 5 μm.

Then, the light-emitting layer is formed on the above hole-injecting layer. The light-emitting layer can be also formed from a desired organic light-emitting material by a vacuum deposition method, a spin coating method, a casting method, etc., while it is preferably formed by a vacuum deposition method since a homogeneous film can be easily obtained and since this method is almost free from the formation of pin holes. When the light-emitting layer is formed by a vacuum deposition method, the vapor deposition conditions differ depending upon a compound used, while they are generally selected from the same condition ranges as the above-described conditions concerning the hole-injecting layer.

After the light-emitting layer is formed, the cathode is formed on the above light-emitting layer by vapor-depositing the metal A and the metal B by multi-source simultaneous vapor deposition, whereby the intended organic EL device can be obtained.

The vapor deposition conditions for forming the cathode by the multi-source simultaneous vapor deposition of the metal A and the metal B differ depending upon the kinds of the metal A and the metal B. Generally, however, it is preferred to select the deposition conditions from the following ranges as required. The temperature of the vapor deposition source is 100° to 5,000° C., the vacuum degree is $1 \times 10^{-2}$ Pa or less, and the substrate temperature is −200° to 500° C. As already described, the deposition rate of the metal A is at least 2 nm/sec., particularly at least 4 nm/sec., and the deposition rate of the metal B is 0.5 nm/sec. or less, particularly 0.2 nm/sec. The film thickness of the cathode is preferably 10 to 400 nm, particularly preferably 30 to 200 nm, as already described. In the production of this organic EL device, the production order may be reversed, and it can be produced in the order of cathode on a substrate/light-emitting layer/hole-injecting layer/anode.

When a direct-current voltage is applied to the organic EL device of the present invention, a voltage of 5 to 40 V is applied with setting the polarity of the anode as + (plus) and that of the cathode as − (minus), whereby light emission is observed. When a voltage is applied with setting the polarity reversely, no current appears, and no light emission is generated. Further, when an alternate current is charged, uniform light emission is observed only when the anode is in the polarity of + and the cathode is in the polarity of −.

The waveform of the alternate current charged may be as required.

Examples of the present invention will be explained hereinafter.

EXAMPLE 1

(Organic EL device having Pb-Mg cathode)

A glass plate having a size of 25×75×1.1 mm on which a 100 nm thick ITO film (corresponding to anode) was formed was used as a transparent substrate. This transparent substrate was subjected to ultrasonic cleaning with isopropyl alcohol for 5 minutes, and then cleaned with pure water for 5 minutes. Further, it was subjected to ultrasonic cleaning with isopropyl alcohol for 5 minutes.

The cleaned transparent substrate was fixed on a substrate holder in a commercially available vacuum deposition apparatus (supplied by Nihon Shinku Gijutsu K.K.]. And, 200 mg of N,N'-diphenyl-N,N'-bis-(3-methylphenyl)-(1,1'-biphenyl)-4,4'-diamine (to be referred to as "TPD" hereinafter) was placed in a molybdenum resistance heating boat, and 200 mg of 4,4'-bis(2,2-diphenylvinyl)biphenyl (to be referred to as "DPVBi" hereinafter) was placed in other molybdenum resistance heating boat. The pressure in the vacuum chamber was reduced to $1 \times 10^{-4}$ Pa.

Then, the molybdenum resistance heating boat in which TPD was placed was heated up to 215° to 220° C. to deposit TPD on the ITO film of the transparent substrate at a deposition rate of 0.1 to 0.3 nm/sec., whereby a hole-injecting layer having a thickness of 60 nm was formed. At this time, the substrate had a temperature of room temperature. Then, while the transparent substrate was allowed to stay without taking it out of the vacuum chamger, the above molybdenum resistance heating boat in which DPVBi was placed was heated up to 220° C. to deposit DPVBi on the hole-injecting layer at a deposition rate of 0.1 to 0.2 nm/sec., whereby a light-emitting layer having a thickness of 40 nm was formed. At this time, the substrate also had a temperature of room temperature.

The substrate on which the anode, hole-injecting layer and light-emitting layer were consecutively formed above was taken out of the vacuum chamber, and after a mask of stainless steel was placed on the above light-emitting layer, the substrate was fixed on the substrate holder again. Then, 200 mg of tris(8-quinolinol)aluminum (Alq.) was placed in a molybdenum resistance heating boat, and the molybdenum resistance heating boat was set in the vacuum chamber. Further, 8 g of a Pb ingot was placed in a basket of alumina-coated tungsten, and 1 g of a ribbon of Mg (work function 3.68 eV) was placed in other molybdenum boat.

Thereafter, the pressure in the vacuum chamber was reduced to $2 \times 10^{-4}$ Pa, and the boat in which Alq. was placed was heated to 280° C. by applying electricity to deposit Alq. at a deposition rate of 0.3 nm/sec., whereby an electron-injecting layer having a thickness of 20 nm was formed.

Then, Pb as the metal A and Mg as the metal B were simultaneously vapor-deposited at a metal A deposition rate of 9 nm/sec. and metal B deposition rate of 0.04 nm/sec. to form a cathode of a Pb-Mg vapor deposited film having a thickness of 200 nm. The anode, hole-injecting layer, light-emitting layer, electron-injecting layer and cathode were formed on the glass substrate as above, whereby an organic EL device was obtained.

The composition ratio of Pb and Mg forming the cathode was calculated on the basis of vapor deposition ratio by the following expression.

$$\frac{V_1 \rho_1}{M_1} : \frac{V_2 \rho_2}{M_2}$$

When a direct-current voltage of 7 V (current density: 2.5 mA/cm$^2$) was applied to the above-obtained organic EL device with setting the polarity of the cathode as − and the polarity of the anode (ITO film) as +, blue uniform light emission at 44 cd/m$^2$ was observed. The power conversion efficiency at this time was as high as 0.78 lumen (lm)/W as shown in Table 1. Further, the organic EL device was allowed to stand in air for 6 months. Then, the state of the cathode was examined to show no change as shown in Table 1, and it was excellent in chemical stability with time.

EXAMPLE 2

(Organic EL device having Pb-Ca cathode)

An organic EL device was obtained in the same manner as in Example 1 except that Ca (work function 2.9) was used as metal B, that the deposition rate of the metal B was set at 0.2 nm/sec., and that the deposition rate of Pb as metal A was set at 8.8 nm/sec.

The composition of the cathode of the above-obtained organic EL device was calculated to show that the cathode was composed of 98.4 at. % of Pb and 1.6% of Ca.

Further, when a direct-current voltage of 7 V (current density: 2.1 mA/cm$^2$) was applied to the above-obtained organic EL device with setting the polarity of the cathode as − and the polarity of the anode (ITO film) as +, blue uniform light emission at 44 cd/m$^2$ was observed. The power conversion efficiency at this time was as high as 0.91 lumen (lm)/W as shown in Table 1. Further, the cathode was excellent in chemical stability with time as shown in Table 1.

EXAMPLE 3

(Organic EL device having Pb-Li cathode)

An organic EL device was obtained in the same manner as in Example 1 except that Li (work function 2.93) was used as metal B, that the deposition rate of the metal B was set at 0.04 nm/sec., and that the deposition rate of Pb as metal A was set at 10 nm/sec.

The composition of the cathode of the above-obtained organic EL device was calculated to show that the cathode was composed of 99.4 at. % of Pb and 0.6 at. % of Li.

Further, when a direct-current voltage of 7 V (current density: 4.9 mA/cm$^2$) was applied to the above-obtained organic EL device with setting the polarity of the cathode as − and the polarity of the anode (ITO film) as +, blue uniform light emission at 84 cd/m$^2$ was observed. The power conversion efficiency at this time was as high as 0.77 lumen (lm)/W as shown in Table 1. Further, the cathode was excellent in chemical stability with time as shown in Table 1.

EXAMPLE 4

(Organic EL device having Pb-Mg cathode)

An organic EL device was obtained in the same manner as in Example 1 except that Mg (work function 3.68) was used as metal B, that the deposition rate of the metal B was set at 0.2 nm/sec., and that the deposition rate of Pb as metal A was set at 5 nm/sec.

The composition of the cathode of the above-obtained organic EL device was calculated to show that the cathode was composed of 95 at. % of Pb and 5 at. % of Mg.

Further, when a direct-current voltage of 7 V (current density: 1.1 mA/cm$^2$) was applied to the above-obtained organic EL device with setting the polarity of the cathode as – and the polarity of the anode (ITO film) as +, blue uniform light emission at 20 cd/m$^2$ was observed. The power conversion efficiency at this time was as high as 0.82 lumen (lm)/W as shown in Table 1. Further, the cathode was excellent in chemical stability with time as shown in Table 1.

Comparative Example 1

An organic EL device was obtained in the same manner as in Example 1 except that the metal B was replaced with Au (work function 5.1), that the deposition rate thereof was set at 0.04 nm/sec., and that the deposition rate of Pb as metal A was set at 10 nm/sec.

The composition of the cathode of the above-obtained organic EL device was calculated to show that the cathode was composed of 99.3 at. % of Pb and 0.7 at. % of Au.

Further, a direct-current voltage of 12 V (current density: 6.3 mA/cm$^2$) was applied to the above-obtained organic EL device with setting the polarity of the cathode as – and the polarity of the anode (ITO film) as +, and light emission was observed. The power conversion efficiency at this time was very low, as low as 0.0083 lumen (lm)/W as shown in Table 1.

Comparative Example 2

An organic EL device was obtained in the same manner as in Example 1 except that the metal B was replaced with Ni (work function 5.15), that the deposition rate thereof was set at 0.04 nm/sec., and that the deposition rate of Pb as metal A was set at 8.3 nm/sec.

The composition of the cathode of the above-obtained organic EL device was calculated to show that the cathode was composed of 98.8 at. % of Pb and 1.2 at. % of Ni.

Further, a direct-current voltage of 15 V (current density: 49 mA/cm$^2$) was applied to the above-obtained organic EL device with setting the polarity of the cathode as – and the polarity of the anode (ITO film) as +, and light emission was observed. The power conversion efficiency at this time was very low, as low as 0.0047 lumen (lm)/W as shown in Table 1.

Comparative Example 3

An organic EL device was obtained in the same manner as in Example 1 except that no metal B was used and that Pb as metal A was vapor-deposited at a deposition rate of 13 nm/sec.

A direct-current voltage of 15 V (current density: 16.8 mA/cm$^2$) was applied to the above-obtained organic EL device with setting the polarity of the cathode as – and the polarity of the anode (ITO film) as +, and light emission was observed. The power conversion efficiency at this time was very low, as low as 0.0088 lumen (lm)/W as shown in Table 1.

Comparative Example 4

An organic EL device was obtained in the same manner as in Example 1 except that the Pb as metal A was replaced with Mg, that In included in the metal B was used, that the deposition rate of Mg was set at 8 nm/sec., and that the deposition rate of In was set at 0.06 nm/sec.

The composition of the cathode of the above-obtained organic EL device was calculated to show that the cathode was composed of 99.3 at. % of Mg and 0.7 at. % of In.

Further, a direct-current voltage of 7 V (current density: 2.1 mA/cm$^2$) was applied to the above-obtained organic EL device with setting the polarity of the cathode as – and the polarity of the anode (ITO film) as +, and light emission was observed. The power conversion efficiency at this time was 0.45 lumen (lm)/W as shown in Table 1. When the above organic EL device was allowed to stand in air for 8 months, the cathode was oxidized to turn transparent, which shows that the cathode was inferior in chemical stability with time, as shown in Table 1.

TABLE 1

| | Cathode | | | |
|---|---|---|---|---|
| | Material (compositional ratio: at/at) | | Deposition rate (nm/sec.) | Work function of metal other than Pb |
| Ex. 1 | Pb—Mg | (99.3/0.7) | 9:0.04 | 3.68 |
| Ex. 2 | Pb—Ca | (98.4/1.6) | 8.8:0.2 | 2.9 |
| Ex. 3 | Pb—Li | (99.4/0.6) | 10:0.04 | 2.93 |
| Ex. 4 | Pb—Mg | (95/5) | 5:0.2 | 3.68 |
| CEx. 1 | Pb—Au | (99.3/0.7) | 10:0.04 | 5.1 |
| CEx. 2 | Pb—Ni | (98.8/1.2) | 8.3:0.04 | 5.15 |
| CEx. 3 | Pb | | 13 | — |
| CEx. 4 | Mg—In | (99.3/0.7) | 8:0.06 | — |

| | Charged voltage (V) | Current density (mA/cm$^2$) | Brightness (cd/m$^2$) | Power conversion efficiency (lm/W) | Chemical stability with time * |
|---|---|---|---|---|---|
| Ex. 1 | 7 | 2.5 | 44 | 0.78 | No change |
| Ex. 2 | 7 | 2.1 | 44 | 0.91 | No change |
| Ex. 3 | 7 | 4.9 | 84 | 0.77 | No change |
| Ex. 4 | 7 | 1.1 | 20 | 0.82 | No change |
| CEx. 1 | 12 | 6.3 | 2 | 0.0083 | No change |
| CEx. 2 | 15 | 49 | 11 | 0.0047 | No change |
| CEx. 3 | 15 | 16.8 | 7.1 | 0.0088 | No change |
| CEx. 4 | 7 | 10 | 100 | 0.45 | Electrode oxidized to be transparent |

Ex. = Example, CEx. = Comparative Example
*Chemical stability with time was evaluated by observing the state of electrode (cathode) after organic EL device was allowed to stand in air for 6 months.

EXAMPLE 5

(Organic EL device having Sn-Mg cathode)

An anode, a hole-injecting layer, a light-emitting layer and an electron-injecting layer were formed on a substrate in the same manner as in Example 1.

Then, Sn as metal A and Mg (work function 3.68 eV) as metal B were simultaneously vapor-deposited at a metal A deposition rate of 9 nm/sec. and a metal B deposition rate of 0.04 nm/sec. to form a cathode of a Sn-Mg vapor deposition film having a thickness of 200 nm. The anode, hole-injecting layer, light-emitting layer, electroninjecting layer and cathode were formed on the glass substrate as above, whereby an organic EL device was obtained.

The composition ratio of Sn and Mg was calculated on the basis of deposition ratio by the expression shown in Example 1. As a result, the Sn content was 99.5%, and the Mg content was 0.5%.

When a direct-current voltage of 7 V (current density: 2.5 mA/cm$^2$) was applied to the above-obtained organic EL device with setting the polarity of the cathode as − and the polarity of the anode (ITO film) as +, blue uniform light emission at 42 cd/m$^2$ was observed. The power conversion efficiency at this time was as high as 0.75 lumen (lm)/W as shown in Table 2. Further, the organic EL device was allowed to stand in air for 6 months. Then, the state of the cathode was examined to show no change as shown in Table 2, and it was excellent in chemical stability with time.

EXAMPLE 6

(Organic EL device having Sn-Ca cathode)

An organic EL device was obtained in the same manner as in Example 5 except that Ca (work function 2.9) was used as metal B, that the deposition rate of the metal B was set at 0.2 nm/sec., and that the deposition rate of Sn as metal A was set at 8.8 nm/sec.

The composition of the cathode of the above-obtained organic EL device was calculated to show that the cathode was composed of 98.8 at. % of Sn and 1.4% of Ca.

Further, when a direct-current voltage of 7 V (current density: 2.0 mA/cm$^2$) was applied to the above-obtained organic EL device with setting the polarity of the cathode as − and the polarity of the anode (ITO film) as +, blue uniform light emission at 44 cd/m$^2$ was observed. The power conversion efficiency at this time was as high as 0.98 lumen (lm)/W as shown in Table 2. Further, the cathode was excellent in chemical stability with time as shown in Table 2.

EXAMPLE 7

(Organic EL device having Sn-Li cathode)

An organic EL device was obtained in the same manner as in Example 5 except that Li (work function 2.93) was used as metal B, that the deposition rate of the metal B was set at 0.05 nm/sec., and that the deposition rate of Sn as metal A was set at 10 nm/sec.

The composition of the cathode of the above-obtained organic EL device was calculated to show that the cathode was composed of 99.4 at. % of Sn and 0.6 at. % of Li.

Further, when a direct-current voltage of 7 V (current density: 4.9 mA/cm$^2$) was applied to the above-obtained organic EL device with setting the polarity of the cathode as − and the polarity of the anode (ITO film) as +, blue uniform light emission at 80 cd/m$^2$ was observed. The power conversion efficiency at this time was as high as 0.73 lumen (lm)/W as shown in Table 2. Further, the cathode was excellent in chemical stability with time as shown in Table 2.

EXAMPLE 8

(Organic EL device having Sn-Mg cathode)

An organic EL device was obtained in the same manner as in Example 5 except that Mg (work function 3.68) was used as metal B, that the deposition rate of the metal B was set at 0.2 nm/sec., and that the deposition rate of Sn as metal A was set at 5 nm/sec.

The composition of the cathode of the above-obtained organic EL device was calculated to show that the cathode was composed of 95.5 at. % of Sn and 4.5 at. % of Mg.

Further, when a direct-current voltage of 7 V (current density: 1.3 mA/cm$^2$) was applied to the above-obtained organic EL device with setting the polarity of the cathode as − and the polarity of the anode (ITO film) as +, blue uniform light emission at 25 cd/m$^2$ was observed. The power conversion efficiency at this time was as high as 0.86 lumen (lm)/W as shown in Table 2. Further, the cathode was excellent in chemical stability with time as shown in Table 2.

Comparative Example 5

An organic EL device was obtained in the same manner as in Example 5 except that the metal B was replaced with Au (work function 5.1), that the deposition rate thereof was set at 0.05 m/sec., and that the deposition rate of Sn as metal A was set at 10 nm/sec.

The composition of the cathode of the above-obtained organic EL device was calculated to show that the cathode was composed of 99.2 at. % of Sn and 0.8 at. % of Au.

Further, a direct-current voltage of 13 V (current density: 7.0 mA/cm$^2$) was applied to the above-obtained organic EL device with setting the polarity of the cathode as − and the polarity of the anode (ITO film) as +, and light emission was observed. The power conversion efficiency at this time was very low, as low as 0.01 lumen (lm)/W as shown in Table 2.

Comparative Example 6

An organic EL device was obtained in the same manner as in Example 5 except that the metal B was replaced with Ni (work function 5.15), that the deposition rate thereof was set at 0.04 nm/sec., and that the deposition rate of Sn as metal A was set at 8.5 nm/sec.

The composition of the cathode of the above-obtained organic EL device was calculated to show that the cathode was composed of 98.9 at. % of Sn and 1.1 at. % of Ni.

Further, a direct-current voltage of 15 V (current density: 50 mA/cm$^2$) was applied to the above-obtained organic EL device with setting the polarity of the cathode as − and the polarity of the anode (ITO film) as +, and light emission was observed. The power conversion efficiency at this time was very low, as low as 0.005 lumen (lm)/W as shown in Table 2.

Comparative Example 7

An organic EL device was obtained in the same manner as in Example 5 except that no metal B was used and that Sn as metal A was vapor-deposited at a deposition rate of 13 nm/sec.

A direct-current voltage of 15 V (current density: 16 mA/cm$^2$) was applied to the above-obtained organic EL device with setting the polarity of the cathode as − and the polarity of the anode (ITO film) as +, and light emission was observed. The power conversion efficiency at this time was very low, as low as 0.0092 lumen (lm)/W as shown in Table 2.

Comparative Example 8

An organic EL device was obtained in the same manner as in Example 5 except that Sn as metal A was replaced with Mg, that In was used as metal B, that the deposition rate of Mg was set at 8 nm/sec., and that the deposition rate of In was set at 0.06 nm/sec.

The composition of the cathode of the above-obtained organic EL device was calculated to show that the cathode was composed of 99.3 at. % of Mg and 0.? at. % of In.

Further, a direct-current voltage of ? V (current density: 2.1 mA/cm$^2$) was applied to the above-obtained organic EL device with setting the polarity of the cathode as − and the polarity of the anode (ITO film) as +, and light emission was observed. The power conversion efficiency at this time was 0.45 lumen (lm)/W as shown in Table 2. When the above organic EL device was allowed to stand in air for 6 months, the cathode was oxidized to turn transparent, which shows that the cathode was inferior in chemical stability with time, as shown in Table 2.

TABLE 2

| | Cathode | | |
|---|---|---|---|
| | Material (compositional ratio: at/at) | Deposition rate (nm/sec.) | Work function of metal other than Sn |
| Ex. 5 | Sn—Mg (99.5/0.5) | 9:0.04 | 3.68 |
| Ex. 6 | Sn—Ca (98.6/1.4) | 8.8:0.2 | 2.9 |
| Ex. 7 | Sn—Li (99.4/0.6) | 10:0.05 | 2.93 |
| Ex. 8 | Sn—Mg (95.5/4.5) | 5:0.2 | 3.68 |
| CEx. 5 | Sn—Au (99.2/0.8) | 10:0.05 | 5.1 |
| CEx. 6 | Sn—Ni (98.9/1.1) | 8.5:0.04 | 5.15 |
| CEx. 7 | Sn | 13 | — |
| CEx. 8 | Mg—In (99.3/0.7) | 8:0.06 | — |

| | Charged voltage (V) | Current density (mA/cm$^2$) | Brightness (cd/m$^2$) | Power conversion efficiency (lm/W) | Chemical stability with time * |
|---|---|---|---|---|---|
| Ex. 5 | 7 | 2.5 | 42 | 0.75 | No change |
| Ex. 5 | 7 | 2.0 | 44 | 0.98 | No change |
| Ex. 7 | 7 | 4.9 | 80 | 0.73 | No change |
| Ex. 8 | 7 | 1.3 | 25 | 0.86 | No change |
| CEx. 5 | 13 | 7.0 | 3 | 0.01 | No change |
| CEx. 6 | 15 | 50 | 12 | 0.005 | No change |
| CEx. 7 | 15 | 16 | 7.1 | 0.0092 | No change |
| CEx. 8 | 7 | 10 | 100 | 0.45 | Electrode oxidized to be transparent |

Ex. = Example, CEx. = Comparative Example
*Chemical stability with time was evaluated by observing the state of electrode (cathode) after organic EL device was allowed to stand in air for 6 months.

EXAMPLE 9

(Organic EL device having Bi-Mg cathode)

An anode, a hole-injecting layer, a light-emitting layer and an electron-injecting layer were formed on a substrate in the same manner as in Example 1.

Then, Bi as metal A and Mg as metal B were simultaneously vapor-deposited at a metal A deposition rate of 9 nm/sec. and a metal B deposition rate of 0.04 nm/sec. to form a cathode of a Bi-Mg vapor deposition film having a thickness of 200 run. The anode, hole-injecting layer, light-emitting layer, electron-injecting layer and cathode were formed on the glass substrate as above, whereby an organic EL device was obtained.

The composition ratio of Bi and Mg was calculated on the basis of deposition ratio by the expression shown in Example 1. As a result, the Bi content was 99.3%, and the Mg content was 0.7%.

When a direct-current voltage of 7 V (current density: 2.6 mA/cm$^2$) was applied to the above-obtained organic EL device with setting the polarity of the cathode as − and the polarity of the anode (ITO film) as +, blue uniform light emission at 45 cd/m$^2$ was observed. The power conversion efficiency at this time was as high as 0.78 lumen (lm)/W as shown in Table 3. Further, the organic EL device was allowed to stand in air for 6 months. Then, the state of the cathode was examined to show no change as shown in Table 3, and it was excellent in chemical stability with time.

EXAMPLE 10

(Organic EL device having Bi-Ca cathode)

An organic EL device was obtained in the same manner as in Example 9 except that Ca (work function 2.9) was used as metal B, that the deposition rate of the metal B was set at 0.2 nm/sec., and that the deposition rate of Bi as metal A was set at 8.8 nm/sec.

The composition of the cathode of the above-obtained organic EL device was calculated to show that the cathode was composed of 98.1 at. % of Bi and 1.9% of Ca.

Further, when a direct-current voltage of 7 V (current density: 2.2 mA/cm$^2$) was applied to the above-obtained organic EL device with setting the polarity of the cathode as − and the polarity of the anode (ITO film) as +, blue uniform light emission at 50 cd/m$^2$ was observed. The power conversion efficiency at this time was as high as 1.00 lumen (lm)/W as shown in Table 3. Further, the cathode was excellent in chemical stability with time as shown in Table 3.

EXAMPLE 11

(Organic EL device having Bi-Li cathode)

An organic EL device was obtained in the same manner as in Example 9 except that Li (work function 2.93) was used as metal B, that the deposition rate of the metal B was set at 0.05 nm/sec., and that the deposition rate of Bi as metal A was set at 10 nm/sec.

The composition of the cathode of the above-obtained organic EL device was calculated to show that the cathode was composed of 99.2 at. % of Bi and 0.8 at. % of Li.

Further, when a direct-current voltage of 7 V (current density: 5.0 mA/cm$^2$) was applied to the above-obtained organic EL device with setting the polarity of the cathode as − and the polarity of the anode (ITO film) as +, blue uniform light emission at 100 cd/m$^2$ was observed. The power conversion efficiency at this time was as high as 0.90 lumen (lm)/W as shown in Table 3. Further, the cathode was excellent in chemical stability with time as shown in Table 3.

EXAMPLE 12

(Organic EL device having Bi-Mg cathode)

An organic EL device was obtained in the same manner as in Example 9 except that Mg (work function 3.68) was used as metal B, that the deposition rate of the metal B was set at 0.2 nm/sec., and that the deposition rate of Bi as metal A was set at 5 nm/sec.

The composition of the cathode of the above-obtained organic EL device was calculated to show that the cathode was composed of 94.2 at. % of Bi and 5.8 at. % of Mg.

Further, when a direct-current voltage of 7 V (current density: 1.4 mA/cm$^2$) was applied to the above-obtained organic EL device with setting the polarity of the cathode as − and the polarity of the anode (ITO film) as +, blue uniform light emission at 22 cd/m$^2$ was observed. The power conversion efficiency at this time was as high as 0.71 lumen (lm)/W as shown in Table 3. Further, the cathode was excellent in chemical stability with time as shown in Table 3.

Comparative Example 9

An organic EL device was obtained in the same manner as in Example 9 except that the metal B was replaced with Au (work function 5.1), that the deposition rate thereof was set at 0.05 nm/sec., and that the deposition rate of Bi as metal A was set at 10 nm/sec.

The composition of the cathode of the above-obtained organic EL device was calculated to show that the cathode was composed of 99.0 at. % of Bi and 1.0 at. % of Au.

Further, a direct-current voltage of 13 V (current density: 7.0 mA/cm$^2$) was applied to the above-obtained organic EL device with setting the polarity of the cathode as − and the polarity of the anode (ITO film) as +, and light emission was observed. The power conversion efficiency at this time was very low, as low as 0.017 lumen (lm)/W as shown in Table 3.

Comparative Example 10

An organic EL device was obtained in the same manner as in Example 9 except that the metal B was replaced with Ni (work function 5.15), that the deposition rate thereof was set at 0.04 nm/sec., and that the deposition rate of Bi as metal A was set at 8.5 nm/sec.

The composition of the cathode of the above-obtained organic EL device was calculated to show that the cathode was composed of 98.5 at. % of Bi and 1.5 at. % of Ni.

Further, a direct-current voltage of 15 V (current density: 50 mA/cm$^2$) was applied to the above-obtained organic EL device with setting the polarity of the cathode as − and the polarity of the anode (ITO film) as +, and light emission was observed. The power conversion efficiency at this time was very low, as low as 0.0046 lumen (lm)/W as shown in Table 3.

Comparative Example 11

An organic EL device was obtained in the same manner as in Example 9 except that no metal B was used and that Bi as metal A was vapor-deposited at a deposition rate of 13 nm/sec, A direct-current voltage of 15 V (current density: 16 mA/cm$^2$) was applied to the above-obtained organic EL device with setting the polarity of the cathode as − and the polarity of the anode (ITO film) as +, and light emission was observed. The power conversion efficiency at this time was very low, as low as 0.01 lumen (lm)/W as shown in Table 3.

Comparative Example 12

An organic EL device was obtained in the same manner as in Example 9 except that Bi as metal A was replaced with Mg, that In was used as metal B, that the deposition rate of Mg was set at 8 nm/sec., and that the deposition rate of In was set at 0.06 nm/sec.

The composition of the cathode of the above-obtained organic EL device was calculated to show that the cathode was composed of 99.3 at. % of Mg and 0.7 at. % of In.

Further, a direct-current voltage of 7 V (current density: 10 mA/cm$^2$) was applied to the above-obtained organic EL device with setting the polarity of the cathode as − and the polarity of the anode (ITO film) as +, and light emission was observed. The power conversion efficiency at this time was 0.45 lumen (lm)/W as shown in Table 3. When the above organic EL device was allowed to stand in air for 6 months, the cathode was oxidized to turn transparent, which shows that the cathode was inferior in chemical stability with time, as shown in Table 3.

TABLE 3

| | Cathode | | |
| --- | --- | --- | --- |
| | Material (compositional ratio: at/at) | Deposition rate (nm/sec.) | Work function of metal other than Bi |
| Ex. 9 | Bi—Mg (99.3/0.7) | 9:0.04 | 3.68 |
| Ex. 10 | Bi—Ca (98.1/1.9) | 8.8:0.2 | 2.9 |
| Ex. 11 | Bi—Li (99.2/0.8) | 10:0.05 | 2.93 |
| Ex. 12 | Bi—Mg (94.2/5.8) | 5:0.2 | 3.68 |
| CEx. 9 | Bi—Au (99.0/1.0) | 10:0.05 | 5.1 |
| CEx. 10 | Bi—Ni (98.5/1.5) | 8.5:0.04 | 5.15 |
| CEx. 11 | Bi | 13 | — |
| CEx. 12 | Bi—In (99.3/0.7) | 8:0.06 | — |

| | Charged voltage (V) | Current density (mA/cm$^2$) | Brightness (cd/m$^2$) | Power conversion efficiency (lm/W) | Chemical stability with time * |
| --- | --- | --- | --- | --- | --- |
| Ex. 9 | 7 | 2.6 | 45 | 0.78 | No change |
| Ex. 10 | 7 | 2.2 | 50 | 1.00 | No change |
| Ex. 11 | 7 | 5.0 | 100 | 0.90 | No change |
| Ex. 12 | 7 | 1.4 | 22 | 0.71 | No change |
| CEx. 9 | 13 | 7.0 | 5 | 0.017 | No change |
| CEx. 10 | 15 | 50 | 11 | 0.0046 | No change |
| CEx. 11 | 15 | 16 | 8 | 0.01 | No change |
| CEx. 12 | 7 | 10 | 100 | 0.45 | Electrode oxidized to be transparent |

Ex. = Example, CEx. = Comparative Example
*Chemical stability with time was evaluated by observing the state of electrode (cathode) after organic EL device was allowed to stand in air for 6 months.

As explained above, the present invention provides a novel organic EL device which has a cathode highly chemical stable with time and exhibits improved power conversion efficiency.

We claim:

1. An organic Electroluminescence device comprising a cathode, an anode and an organic light-emitting material disposed between said cathode and said anode, wherein said cathode is formed by a vapor deposited film containing (a) at least one metal A selected from the group consisting of Pb, Sn and Bi and (b) at least one metal B selected from the group consisting of Li, Ba, La, Ca, Na, K, Y, Mg and Yb, said cathode having a metal A content of 95 to 99.99 at. %.

2. The organic electroluminescence device according to claim 1, wherein the metal B is at least one metal selected from the group consisting of Ca, Ba and Yb.

3. The organic electroluminescence device according to claim 1, wherein the metal B is Li.

4. The organic electroluminescence device according to claim 1, wherein the metal A is Pb and the metal B is Li.

5. The organic electroluminescence device according to claim 1, wherein the organic light-emitting material is selected from the group consisting of benzothiazole, benzoimidazole, a benzooxazole fluorescent brightener, a metal chelated oxinoid compound and a styrylbenzene compound.

6. The organic electroluminescence device according to claim 1, wherein the organic light-emitting material has a film thickness of 5 nm to 5 µm.

7. The organic electroluminescence device according to claim 6, wherein the anode has a thickness of 10 nm to 10 µm.

8. The organic electroluminescence device according to claim 6, wherein the anode has a thickness of 10 to 200 nm.

9. The organic electroluminescence device according to claim 8, wherein the anode has a work function of at least 4 eV.

10. The organic electroluminescence device according to claim 9, wherein the anode comprises Au, CuI, ITO, $SnO_2$ or Zn.

* * * * *